(12) United States Patent
Tsao et al.

(10) Patent No.: US 8,264,384 B2
(45) Date of Patent: Sep. 11, 2012

(54) KEYBOARD CONTROL CIRCUIT

(75) Inventors: Mao-Ta Tsao, Taipei (TW); Wen-Tong Liu, Taipei (TW)

(73) Assignees: Silitek Electronic (Guangzhou) Co., Ltd., Guangzhou (CN); Lite-On Tehcnology Corp., Taipei (TW)

( * ) Notice: Subject to any disclaimer, the term of this patent is extended or adjusted under 35 U.S.C. 154(b) by 917 days.

(21) Appl. No.: 12/318,827

(22) Filed: Jan. 9, 2009

(65) Prior Publication Data

US 2010/0073204 A1    Mar. 25, 2010

(30) Foreign Application Priority Data

Sep. 25, 2008  (CN) .......................... 2008 1 0161418

(51) Int. Cl.
*H04M 11/00* (2006.01)
(52) U.S. Cl. .............................. 341/26; 341/22; 400/489
(58) Field of Classification Search .................... 341/26; 400/489

See application file for complete search history.

(56) References Cited

U.S. PATENT DOCUMENTS

| | | | | |
|---|---|---|---|---|
| 4,739,310 A | * | 4/1988 | Yamamoto | 341/25 |
| 5,220,323 A | * | 6/1993 | Ito et al. | 341/24 |
| 2007/0182596 A1 | * | 8/2007 | Chen | 341/26 |
| 2007/0212152 A1 | * | 9/2007 | Chen | 400/489 |
| 2008/0316067 A1 | * | 12/2008 | Siepmann | 341/26 |

* cited by examiner

*Primary Examiner* — Timothy Edwards, Jr.
(74) *Attorney, Agent, or Firm* — Rosenberg, Klein & Lee

(57) ABSTRACT

A keyboard control circuit for a keyboard having P keys includes an array module that includes P key switches, and a key-matrix having N scan lines that intersect M return lines to form N×M intersections, where P<N×M. The intersections include ghost key positions free of the key switches, and safe key positions being of a number at least equal to P. Each key switch is disposed at a corresponding safe key position. Each ghost key position cooperates with a corresponding group of first, second and third ones of the safe key positions to constitute four corners of a rectangle in the key matrix. A processing unit provides a scan signal to each scan line during a scan period, receives at least one scan line from the return lines in response to operation of at least one key switch, and outputs an input signal corresponding to operation of the at least one key switch.

6 Claims, 2 Drawing Sheets

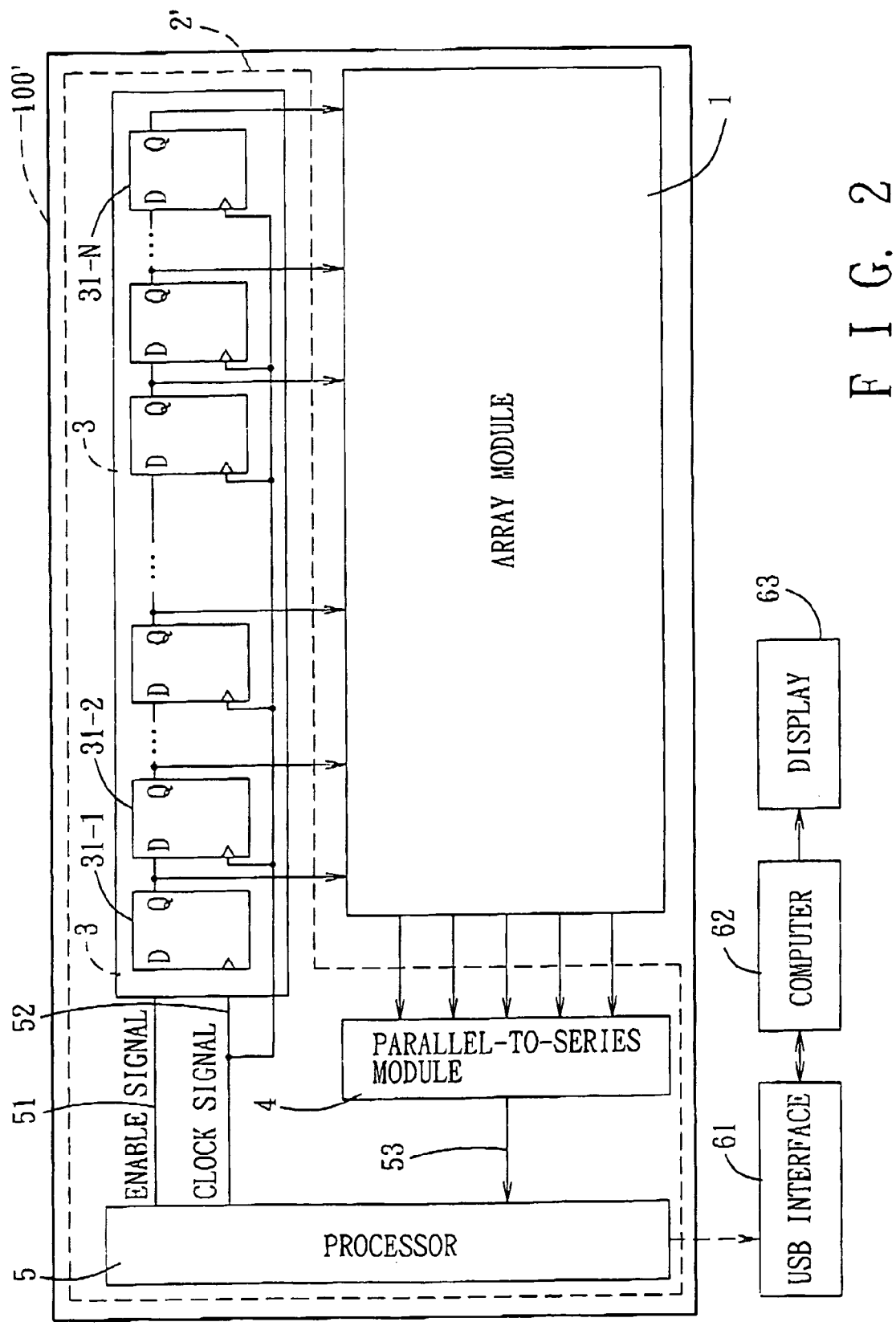
F I G. 2

US 8,264,384 B2

KEYBOARD CONTROL CIRCUIT

CROSS-REFERENCE TO RELATED APPLICATION

This application claims priority of Chinese Application No. 200810161418-5, filed on Sep. 25, 2008.

BACKGROUND OF THE INVENTION

1. Field of the Invention

The invention relates to a keyboard, more particularly to a keyboard control circuit.

2. Description of the Related Art

A conventional keyboard control circuit for a keyboard having 144 (18×8) keys includes an array module and a processing unit. The array module includes 18 scan lines, 8 return lines that intersect the scan lines to form 144 intersections, and 144 key switches each disposed at a corresponding intersection and operable to control conduction between a corresponding scan line and a corresponding return line intersecting each other at the corresponding intersection. The processing unit provides a scan signal to each of the scan lines during a scan period, receives at least one scan signal from the return lines in response to operation of at least one of the key switches, and outputs an input signal corresponding to operation of the at least one of the key switches.

Assume that four key switches (A, B, C, D) are disposed respectively at first, second, third and fourth intersections that are formed by first and second scan lines (x1, x2) and first and second return lines (y1, y2) such that the first, second, third and fourth intersections respectively have a scan line coordinate and a return line coordinate indicated by (x1, y1), (x2, y1), (x1, y2), and (x2, y2) When the key switches (A, B, C) are simultaneously operated, the processing unit receives the scan signal from the first return line (y1) through the first and second scan lines (x1, x2) and from the second return line (y2) through the first scan line (x1). However, the processing unit further receives the scan signal from the second return line (y2) through the second scan line (x2), even though the key switch (D) is not operated. As such, the fourth intersection is regarded as a ghost key position.

In gaming applications, occurrence of ghost keys is not permitted. In order to overcome occurrence of ghost keys, a diode is disposed at each of the intersections. However, due to the presence of the diodes, the array module has a relatively large size, a complicated wiring, and a relatively high cost.

SUMMARY OF THE INVENTION

Therefore, an object of the present invention is to provide a keyboard control circuit that can prevent occurrence of ghost keys and that can be fabricated at a relatively low cost.

According to the present invention, there is provided a keyboard control circuit for a keyboard that has a number (P) of keys. The keyboard control circuit comprises:

an array module including a key matrix having a number (N) of scan lines, and a number (M) of return lines that intersect the number (N) of the scan lines to form a number (N×M) of intersections, where P<(N'M), each of the intersections having a scan line coordinate $(X_i)$, where i ranges from 1 to N, and a return line coordinate $(Y_j)$, where j ranges from 1 to M, the intersections including safe key positions and ghost key positions, the safe key positions being of a number that is at least equal to P, wherein each of the ghost key positions corresponds to a group of first, second and third ones of the safe key positions, in which the first and second ones of the safe key positions have the same return line coordinate, in which the first and third ones of the safe key positions have the same scan line coordinate, in which a corresponding one of the ghost key positions and the second one of the safe key positions have the same scan line coordinate, and in which the corresponding one of the ghost key positions and the third one of the safe key positions have the same return line coordinate, and a number (P) of key switches, each of which is disposed at a corresponding one of the safe key positions in the key matrix and is operable to control conduction between a corresponding one of the scan lines and a corresponding one of the return lines intersecting each other at the corresponding one of the safe key positions in the key matrix, wherein the ghost key positions are free of the key switches; and a processing unit coupled to the scan lines and the return lines, providing a scan signal to each of the scan lines during a scan period, receiving at least one scan signal from the return lines in response to operation of at least one of the key switches, and outputting an input signal corresponding to operation of the at least one of the key switches.

BRIEF DESCRIPTION OF THE DRAWINGS

Other features and advantages of the present invention will become apparent in the following detailed description of the preferred embodiments with reference to the accompanying drawings, of which:

FIG. 2 is a schematic circuit block diagram illustrating the second preferred embodiment of a keyboard control circuit according to the present invention.

DETAILED DESCRIPTION OF THE PREFERRED EMBODIMENTS

Figure 1:
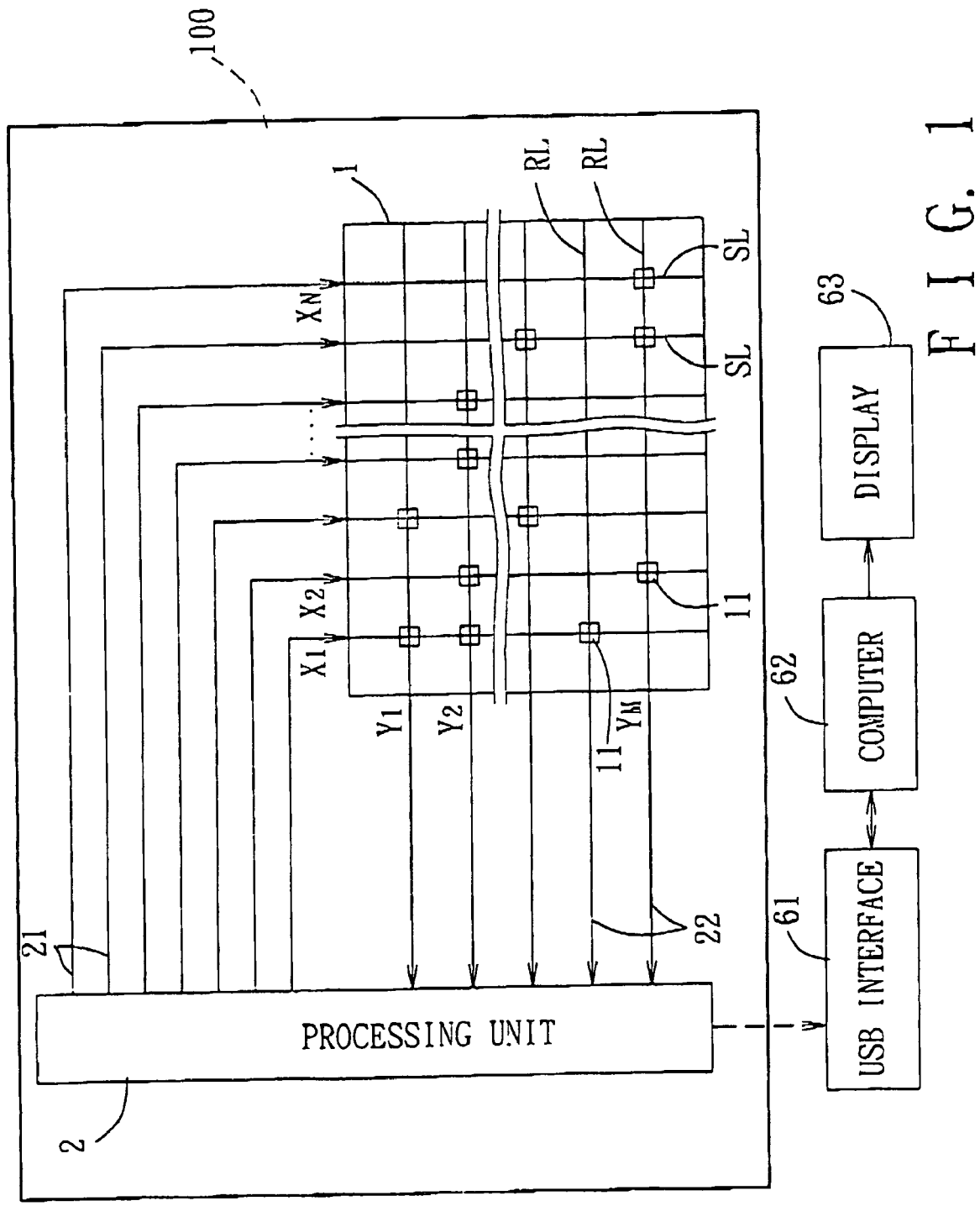
FIG. 1 is a schematic circuit block diagram illustrating the first preferred embodiment of a keyboard control circuit according to the present invention.

Before the present invention is described in greater detail, it should be noted that like elements are denoted by the same reference numerals throughout the disclosure.

Referring to FIG. 1, the first preferred embodiment of a keyboard control circuit 100 according to the present invention is shown to include an array module 1 and a processing unit 2. The keyboard control circuit 100 is adapted for use with a keyboard having a number (P) of keys (not shown).

The array module 1 includes a key matrix and a number (P) of key switches 11.

The key matrix has a number (N) of scan lines (SL), and a number (M) of return lines (RL) that intersect the number (N) of the scan lines (SL) to form a number (N×M) of intersections, where P<(N×M). Each of the intersections has a scan line coordinate $(X_i)$, where i ranges from 1 to N, and a return line coordinate $(Y_j)$ where j ranges from 1 to M. The intersections include safe key positions and ghost key positions. The safe key positions are of a number that is at least equal to P. Each of the ghost key positions corresponds to a group of first, second and third ones of the safe key positions, in which the first and second ones of the safe key positions have the same return line coordinate, in which the first and third ones of the safe key positions have the same scan line coordinate, in which a corresponding one of the ghost key positions and the second one of the safe key positions have the same scan line coordinate, and in which the corresponding one of the ghost key positions and the third one of the safe key positions have the same return line coordinate. The ghost key positions are free of the key switches 11.

Each of the key switches 11 is disposed at a corresponding one of the safe key positions in the key matrix, and is operable to control conduction between a corresponding one of the scan lines (SL) and a corresponding one of the return lines (RL) intersecting each other at the corresponding one of the safe key positions in the key matrix.

In this embodiment, the processing unit 2 has a number (N) of scan terminals 21 coupled respectively to the scan lines (SL) of the key matrix of the array module 1, and a number (M) of return terminals 22 coupled respectively to the return lines (RL) of the key matrix of the array module 1. The processing unit 2 provides a scan signal to each of the scan lines (SL) via the scan terminals 21 during a scan period, and receives at least one scan signal from the return lines (RL) via the return terminals 22 in response to operation of at least one of the key switches 11, and outputs an input signal corresponding to operation of the at least one of the key switches 11. In this embodiment, the input signal outputted by the processing unit 2 is adapted to be transmitted to a computer 62 through a USB interface 61 such that the computer 62 generates an output corresponding to the input signal from the keyboard control circuit 100 and that the output is displayed on a display 63 coupled to the computer 62.

FIG. 2 illustrates the second preferred embodiment of a keyboard control circuit 100' according to this invention, which is a modification of the first preferred embodiment. In this embodiment, the processing unit 2' includes a processor 5, a series-to-parallel module 3, and a parallel-to-series module 4.

The processor 5 has a scan port 51 for providing an enable signal, a clock port 52 for providing a clock signal, and a return port 53.

The series-to-parallel module 3 is coupled to the enable port 51 and the clock port 52 for receiving the enable signal and the clock signal therefrom, and outputs the scan signal in sequence to the scan lines during the scan period in response to the enable signal from the processor 5. In this embodiment, the series-to-parallel module 3 includes a number (N) of cascaded shift registers 31-1, 31-2, . . . , 31-N, each of which has an output end coupled to a corresponding one of the scan lines for outputting the scan signal thereto, and a clock input end coupled to the clock port 52 of the processor 5' for receiving the clock signal therefrom. A first shift register 31-1 has an input end coupled to the enable port 51 of the processor 5 for receiving the enable signal therefrom. The shift registers 31-1, 31-2, . . . , 31-N are D-type flip-flops.

The parallel-to-series module 4 is coupled to the return lines of the key matrix of the array module 1, and the return port 53 of the processor 5. The parallel-to-series module 4 receives the at least one scan signal from the return lines, and outputs an output signal that indicates respective conduction states of the return lines in sequence.

The processor 5 receives the output signal from the parallel-to-series module 4 via the return port 53, and outputs the input signal according to the output signal.

In sum, since each key switch 11 is appropriately disposed at the corresponding one of the safe key positions in the key matrix, and since the ghost key positions are free of the key switches 11, the keyboard control device 100, 100' of this invention is capable of preventing occurrence of ghost keys without requirement for diodes. Moreover, the array module can be implemented as a membrane circuit. Therefore, the keyboard control device 100, 100' of this invention can be fabricated at a relatively low cost.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A keyboard control circuit for a keyboard that has a number (P) of keys, said keyboard control circuit comprising:
    an array module including
        a key matrix having a number (N) of scan lines, and a number (M) of return lines that intersect the number (N) of the scan lines to form a number (N×M) of intersections, where P<(N×M), each of said intersections having a scan line coordinate $(X_i)$, where i ranges from 1 to N, and a return line coordinate $(Y_j)$ where j ranges from 1 to M, said intersections including safe key positions and ghost key positions, the safe key positions being of a number that is at least equal to P,
        wherein each of the ghost key positions corresponds to a group of first, second and third ones of the safe key positions, in which the first and second ones of the safe key positions have the same return line coordinate, in which the first and third ones of the safe key positions have the same scan line coordinate, in which a corresponding one of the ghost key positions and the second one of the safe key positions have the same scan line coordinate, and in which the corresponding one of the ghost key positions and the third one of the safe key positions have the same return line coordinate, and
        a number (P) of key switches, each of which is disposed at a corresponding one of the safe key positions in said key matrix and is operable to control conduction between a corresponding one of said scan lines and a corresponding one of said return lines intersecting each other at the corresponding one of the safe key positions in said key matrix,
        wherein the ghost key positions are free of said key switches; and
    a processing unit coupled to said scan lines and said return lines, providing a scan signal to each of said scan lines during a scan period, receiving at least one scan signal from said return lines in response to operation of at least one of said key switches, and outputting an input signal corresponding to operation of the at least one of said key switches.

2. The keyboard control circuit as claimed in claim 1, wherein said processing unit includes:
    a processor for providing an enable signal; and
    a series-to-parallel module coupled to said processor and said scan lines, receiving the enable signal from said processor, and outputting the scan signal in sequence to said scan lines during the scan period in response to the enable signal from said processor.

3. The keyboard control circuit as claimed in claim 2, wherein said series-to-parallel module includes a number (N) of cascaded shift registers, each of which has an output end coupled to a corresponding one of said scan lines for outputting the scan signal thereto, a first one of said shift registers having an input end coupled to said processor for receiving the enable signal therefrom.

4. The keyboard control circuit as claimed in claim 3, wherein said shift registers are D-type flip-flops.

5. The keyboard control circuit as claimed in claim 2, wherein said processor has a return port and said processing unit further includes a parallel-to-series module coupled to said return lines and said return port of said processor, said parallel-to-series module receiving the at least one scan signal from said return lines, and outputting an output signal that indicates respective conduction states of said return lines in sequence, said processor receiving the output signal from said parallel-to-series module via said return port and outputting the input signal according to the output signal.

6. The keyboard control circuit as claimed in claim 1, wherein said processing unit includes:
   a processor having a return port; and
   a parallel-to-series module coupled to said return lines and said return port of said processor, said parallel-to-series module receiving the at least one scan signal from said return lines, and outputting an output signal that indicates respective conduction states of said return lines in sequence;
   said processor receiving the output signal from said parallel-to-series module via said return port and outputting the input signal according to the output signal.

* * * * *